United States Patent

Gardner et al.

[11] Patent Number: 5,946,581
[45] Date of Patent: Aug. 31, 1999

[54] METHOD OF MANUFACTURING A SEMICONDUCTOR DEVICE BY DOPING AN ACTIVE REGION AFTER FORMATION OF A RELATIVELY THICK OXIDE LAYER

[75] Inventors: Mark I. Gardner, Cedar Creek; Thomas E. Spikes, Jr., Round Rock; Robert Paiz, Austin, all of Tex.

[73] Assignee: Advanced Micro Devices, Austin, Tex.

[21] Appl. No.: 08/780,644

[22] Filed: Jan. 8, 1997

[51] Int. Cl.⁶ .................................................. H01L 21/336
[52] U.S. Cl. .......................... 438/307; 438/303; 438/298; 257/288
[58] Field of Search .................................. 438/307, 297, 438/298, 303; 257/288

[56] References Cited

U.S. PATENT DOCUMENTS

| | | | |
|---|---|---|---|
| 4,512,073 | 4/1985 | Hsu | 438/307 |
| 5,371,026 | 12/1994 | Hayden et al. | 438/303 |
| 5,407,847 | 4/1995 | Hayden et al. | 438/305 |
| 5,780,336 | 7/1998 | Son | 438/251 |
| 5,786,257 | 10/1996 | Wen | 438/307 |

OTHER PUBLICATIONS

S. Wolf, Silicon Processing for the VLSI Era, vol. 2: Processing Integration, pp. 354–363 and 437–439, copyright 1990.
Wolf Silicon Processing for the VSLI Era Lattice Press pp. 354–357, 1990.

*Primary Examiner*—Chandra Chaudhari
*Assistant Examiner*—David S Blum
*Attorney, Agent, or Firm*—Merchant & Gould P.C.

[57] ABSTRACT

In a semiconductor device fabrication process, an active region of the semiconductor device is formed by doping an active region after formation of a relatively thick oxide layer. According to the process, a gate electrode is formed on a substrate and a relatively thick oxide layer is formed over the gate electrode. Portions of the relatively thick oxide layer are removed to expose a region of the substrate adjacent the gate electrode. The exposed region is then doped with a dopant to form an active region. The active region may form an LDD region. The relatively thick oxide layer may comprise a contact formation layer.

29 Claims, 5 Drawing Sheets

METHOD OF MANUFACTURING A SEMICONDUCTOR DEVICE BY DOPING AN ACTIVE REGION AFTER FORMATION OF A RELATIVELY THICK OXIDE LAYER

FIELD OF THE INVENTION

The present invention is directed generally to a method of manufacturing a semiconductor device and, more particularly, to a method of forming a semiconductor device by doping an active region after formation of a relatively thick oxide layer.

BACKGROUND OF THE INVENTION

Over the last few decades, the electronics industry has undergone a revolution by the use of semiconductor technology to fabricate small, highly integrated electronic devices. The most common and important semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

The source/drain regions 105, illustrated in FIG. 1, are lightly-doped-drain (LDD) structures. Each LDD structure includes a lightly-doped, lower conductivity region 106 near the channel region 107 and a heavily-doped, higher conductivity region 104 typically connected to the source/drain terminal. Generally, the LDD structures are typically formed by: implanting a first dopant into active regions adjacent the gate electrode 103 at relatively low concentration levels to form the lightly-doped regions 106; forming spacers 108 on sidewalls of the gate electrode 103; and implanting a second dopant into the active regions at higher concentration levels to form the heavily-doped regions 104. The substrate is typically annealed to drive the dopant in the heavily-doped regions deeper into the substrate 106.

After the LDD structures have been formed, a relatively thick oxide layer (not shown), referred to as a contact formation layer, is disposed over the substrate 101. Openings are generally cut into the contact formation layer to expose the source/drain regions 105 and the surface of the gate electrode 103. The exposed areas are then filled with a metal, such as tungsten, which is used to connect the active elements with other devices on the chip.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

The depth and extent of lateral diffusion of the LDD region are important dimensions which must be scaled down as the device structure is made smaller. Lateral diffusion of the dopant used to form the LDD region shortens the effective length of the channel region and consequently limits the ability to scale down the semiconductor device. Lateral diffusion of the LDD region dopant often occurs during processing in fabrication steps subsequent to LDD region formation, including the annealing step used to drive-in the dopants of the heavily-doped, higher conductivity region. A more detailed description of LDD structures and the fabrication thereof may be found in S. Wolf, *Silicon Processing for the VLSI Era*, Vol. 2: Processing Integration, pp. 354–363 and 436–439.

SUMMARY OF THE INVENTION

Generally, the present invention relates to a method of forming a semiconductor device by doping an active region after formation of a relatively thick oxide layer.

In accordance with one embodiment of the invention, a gate electrode is formed on a substrate and a relatively thick oxide layer is formed over the gate electrode. A portion of the relatively thick oxide layer is removed to expose a region of the substrate adjacent the gate electrode. The exposed region is then doped with a dopant to form an active region. The active region may form an LDD region. The relatively thick oxide layer may comprise a contact formation layer.

A semiconductor device, in accordance with an embodiment of the invention, includes a substrate and at least one gate electrode disposed on the substrate. Adjacent the gate electrode, there is disposed an LDD structure having a lightly-doped region. The lightly-doped region extends beneath the gate electrode a lateral distance of less than 100 angstroms. In one aspect of the invention, the lightly-doped region extends beneath the gate electrode by a lateral distance ranging between about 50 angstroms and 100 angstroms.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
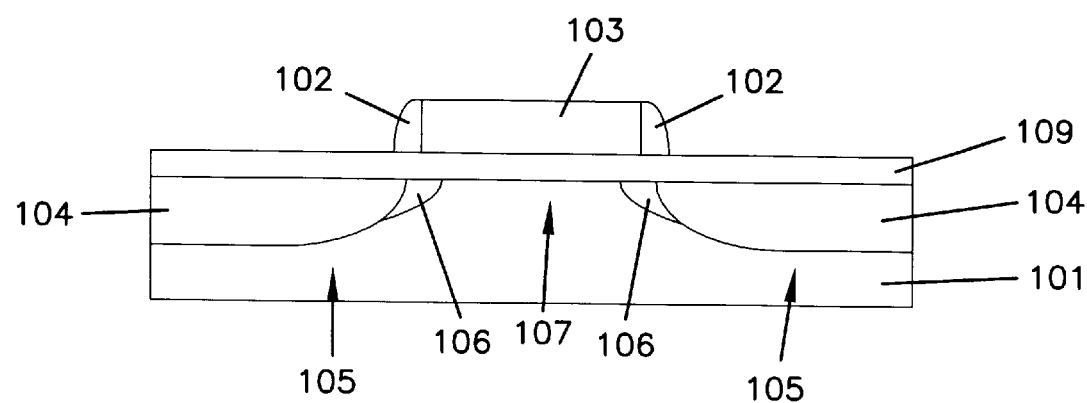
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices, including in particular MOS structures. While the present invention is not so limited, an appreciation of various aspects of the invention will be gained through a discussion of the fabrication process and characteristics of such a device in connection with the examples provided below.

Figure 2A:
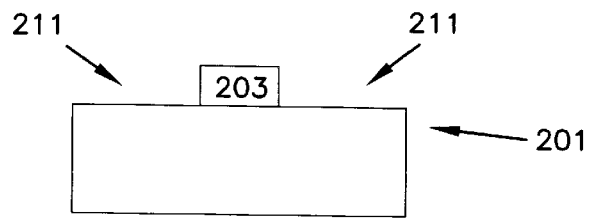
FIGS. 2A–2G illustrate a fabrication process in accordance with one embodiment of the invention.

FIGS. 2A–2G illustrate a process for fabricating a semiconductor device having an LDD structure in which the lightly-doped regions of the LDD structure are formed after the formation of a relatively thick oxide layer, such as a contact formation layer or other layer. Using known techniques, gate electrodes (only one of which is shown) are formed on a substrate 201. The gate electrode 203 is typically insulated from the substrate by a thin gate oxide layer (not shown). The resultant structure is illustrated in FIG. 2A. It will be appreciated that a number of different known fabrication techniques could be used to obtain the gate electrode structure depicted as FIG. 2A.

Figure 2B:
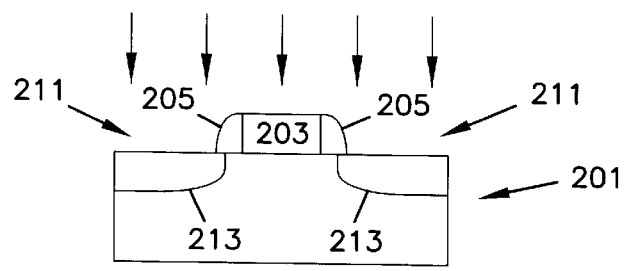

Portions of the semiconductor substrate 201 which lie adjacent the gate electrode 203 generally define active regions 211 of the substrate 201. As used herein, the term active region encompasses a region where an active portion of the device resides whether the active portion has been or will be formed. The active regions 211 may serve, for example, as source/drain regions of a semiconductor device. In the illustrative embodiment of FIGS. 2A–2G, the active regions 211 serve as LDD structures. An LDD structure is illustrated in FIG. 2G.

A spacer layer, typically an oxide layer such as $SiO_2$, is formed over the substrate 201 and the gate electrode 203 and portions of the spacer layer are removed to form spacers 205 on the sidewalls of the gate electrode 203. Conventional deposition and etching techniques may be used to form the spacers. Following spacer formation, a source/drain implant is carried out to implant a dopant into the active regions 211 of the substrate 201 to form heavily-doped regions 213 in the active regions 211 as illustrated in FIG. 2B. The substrate 201 is then annealed to drive the dopant further into the substrate 201. This anneal is typically performed at elevated temperatures of about 1100–1200° C. using rapid thermal processing.

Figure 2C:
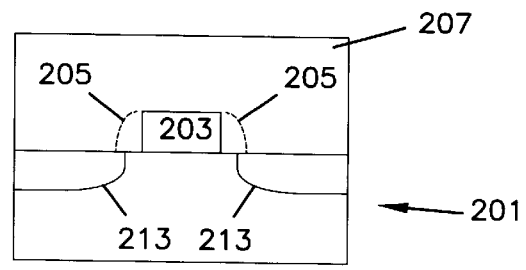

After formation and annealing of the heavily-doped region 213, a relatively thick oxide layer 207 such as $SiO_2$ is formed over the substrate 201, as illustrated in FIG. 2C. In accordance with one embodiment of the invention, the oxide layer 207 generally has a sufficiently planar surface and thickness above the gate electrode 203 such that when a portion of the oxide layer 207 is removed from around the gate electrode 203 during subsequent fabrication steps (as will be discussed more fully below) minimal or no oxide remains on the sidewalls of the gate electrode 203.

The thickness of the relatively thick oxide layer 207 may, for example, range from 3000 angstroms (Å) up to about 15,000 Å or even higher depending on fabrication design constraints. Though the spacers 205 typically become indistinguishable from the relatively thick oxide layer, the spacers 205 remain illustrated in FIG. 2C to more clearly show that the spacers 205 are removed in subsequent processing as will be described more fully below.

The relatively thick spacer oxide layer 207 is typically deposited and polished using, for example, a chemical-mechanical polish (CMP) process, to form a planarized layer. In one embodiment, the thick oxide layer 207 is a contact formation layer formed over the substrate 201 prior to contact formation. The contact formation layer may be, for example, a doped film of $SiO_2$ deposited by chemical vapor deposition (CVD). Typically, contact formation layers are about 1 µm (10,000 Å) thick and are planarized using a CMP process. It should be appreciated, however, that other types of planarized layers may also be employed, including for example, other planarized layers used to form wiring or interconnects on other areas of the substrate 201.

Figure 2D:
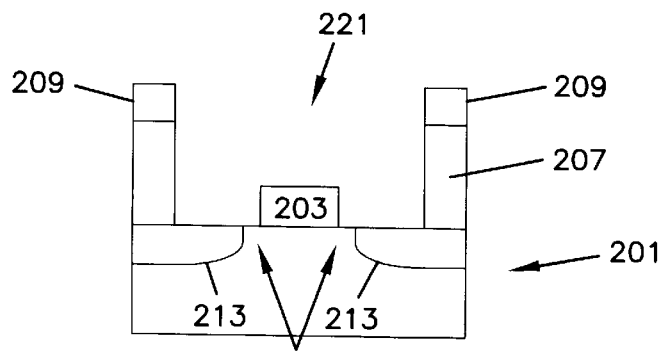

A mask 209 is then formed over the relatively thick oxide layer 207 and used to expose at least portions of the active regions 211, as illustrated in FIG. 2D. The mask 209 may, for example, be formed by developing and selectively removing a photoresist using conventional photolithographic techniques. In particular, using the mask 209, a portion of the relatively thick oxide layer 207 is removed, for example, by etching, to define an opening 221 providing access to the active regions 211. As illustrated in FIG. 2D, the spacers 205 adjacent the sidewalls of the gate electrode 203 are also removed during this oxide removal process. It should be appreciated that the additional masking may also be used to expose other areas on the substrate 201 where access to the substrate 201 through the relatively thick oxide layer 205 is desired. Such access may, for example, be desired to form metal contacts with other active regions or gate electrodes.

Figure 2E:
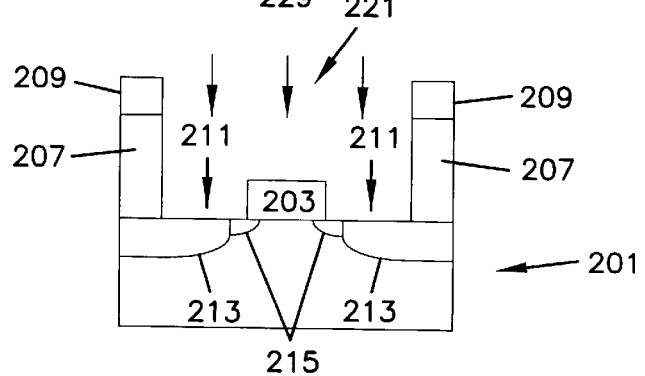

The exposed portions of the active regions 211 are then doped with a dopant to form lightly-doped regions 215 between the gate electrode 203 and the heavily-doped regions 213. In the illustrated embodiment, the lightly-doped regions are LDD regions. The resultant structure is depicted in FIG. 2E. The LDD region 215 may be formed by implantation.

As will be appreciated, in the above embodiment, the LDD regions 215 are formed after the heavily-doped regions 213 have been annealled. Thus, a higher dopant concentration can be used to form the LDD regions 215, as compared to conventional LDD implants, since the dopants will be subjected to less heat and will experience less diffusion. For example, in the above process, dopant concentrations used to dope the LDD region can range from 1E14 to 1E15 dopant atoms/$cm^2$. This represents dopant concentrations approximately an order of magnitude higher than dopant concentrations in conventional LDD implants.

The substrate 201 may be heated or annealed after forming the LDD regions to move the lightly-doped region junctions a desired amount. This substrate heating may be performed at a relatively low temperatures, for example, 700–900° C., to achieve desired junction profiles. Together the lightly-doped regions 215 and heavily-doped regions 213 form LDD structures for the active regions 211.

Figure 2F:
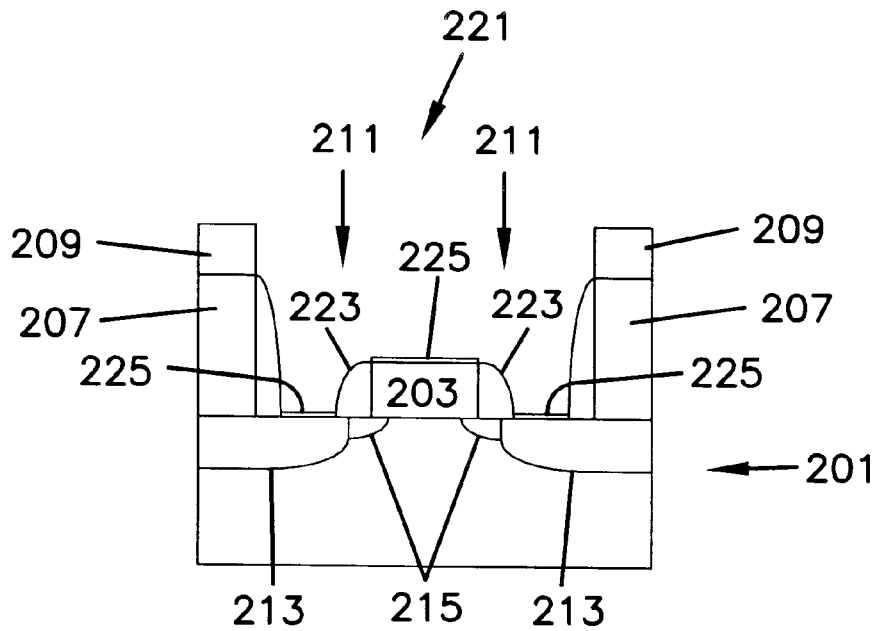
Figure 2G:
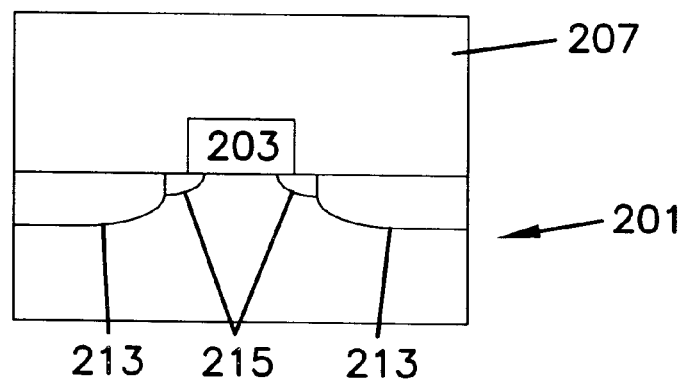

Following formation of the LDD structures, metal contacts may be formed to connect the LDD structures with voltage sources. FIGS. 2F and 2G illustrate one embodiment for forming such metal contacts. According to this embodiment, relatively thin spacers 223 are formed over on the sidewalls of the gate electrode 201. The relatively thin spacers 223 are used to isolate the gate electrode 203 and active regions 211 in preparation for silicidation. A silicide layer 225 is then formed over the gate electrode 203 and the exposed portions of the active regions 213. The resultant structure is illustrated in FIG. 2F.

The silicide layer 225 may, for example, be formed using well-know silicidation techniques. The spacers 223 are advantageously relatively thin (as compared to spacers used to align a source/drain implant), since the spacers 223 are not being used to define the source/drain implant region. Using relatively thin spacers, the silicide layer 225 over the active regions 211 is disposed closer to the gate electrode 203. This reduces the parasitic resistance between the metal contact (to be formed) and the LDD structure and enhances transistor performance.

The opening 221 is then filled with an oxide and the structure is polished to form a contact formation layer 229, as illustrated in FIG. 2G. This can be done by, for example, using conventional deposition and CMP techniques. Using conventional techniques, openings are then cut in the contact formation layer 229 and metal contacts formed on the LDD structures and gate electrode 203. Conventional fabrication processes may be carried out to completely form the device structure.

Using the above process, greater control over the profile of an LDD region is provided as compared to conventional implant techniques. Moreover, shallower LDD regions and LDD regions with minimal lateral dopant diffusion can be formed. This results from the order of the steps by which the LDD structures are formed. For example, during conventional LDD region formation, an LDD dopant is typically implanted into the substrate to a certain initial depth and lateral distance. During subsequent heating of the substrate, the dopant diffuses and penetrates both vertically and laterally into the substrate. In contrast, the above process forms LDD regions after the heavily-doped source/drain region and the source/drain anneal. The above process also forms the LDD regions at a later stage in the semiconductor fabrication process (e.g., after the contact formation layer). Consequently, the LDD regions are not subject to heat treatment associated with fabrication processes occurring in earlier stages of the fabrication process, such as the formation of intermediate metal layers, source/drain regions on other areas of the substrate, etc. Using the above process, it is possible to form LDD regions having lateral dopant diffusion less than 100 Å and generally ranging from about 50 Å to 100 Å. Using conventional techniques, minimum LDD dopant diffusion distances of about 300 to 400 Å can be achieved.

Figure 3A:
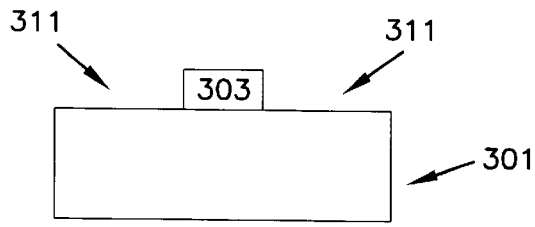
FIGS. 3A–3E illustrate another fabrication process in accordance with another embodiment of the invention.
Figure 3B:
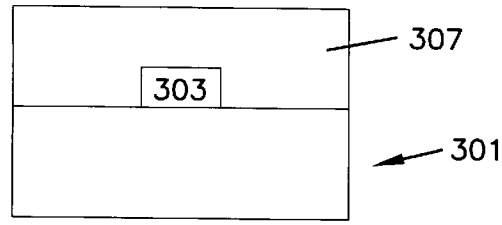
Figure 3C:
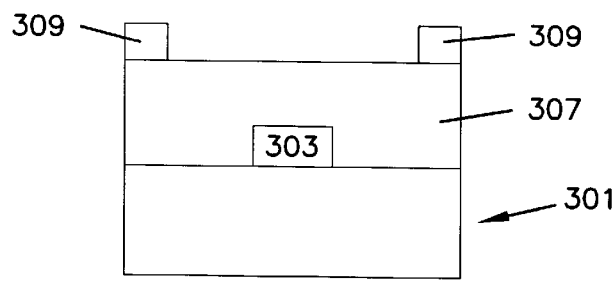
Figure 3D:
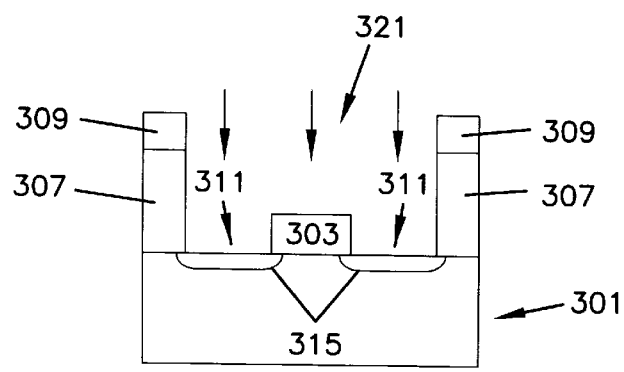
Figure 3E:
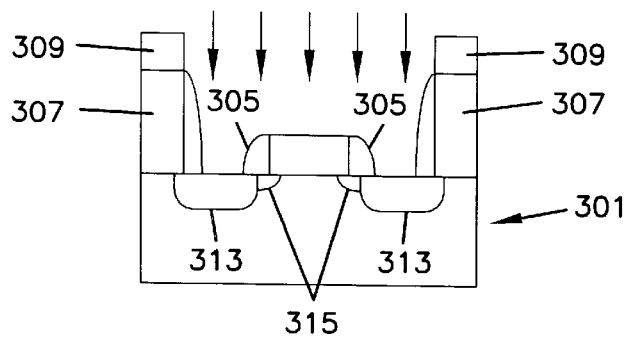

FIGS. 3A–3E illustrate another embodiment of the invention in which both the lightly-doped regions and heavily-doped regions of an active region of a semiconductor device are formed after the formation of a relatively thick oxide layer. Using known techniques, gate electrodes (only one of which is shown) are formed on a substrate 301. The gate electrode 303 is typically insulated from the substrate by a thin gate oxide layer (not shown). The resultant structure is illustrated in FIG. 3A. Portions of the semiconductor substrate 301 which lie adjacent the gate electrode 303 generally define active regions 311 of the substrate 301. In the illustrative embodiment of FIGS. 3A–3E, the active regions 311 are used to form LDD structures. An LDD structure is illustrated in FIG. 3E.

After formation of the gate electrode 303, a relatively thick oxide layer 307 such as $SiO_2$ is formed over the substrate 301. The characteristics of the relatively thick oxide layer 307 are similar to those of one described above. In particular, the oxide layer 307 generally has a sufficient thickness and planar surface over the gate electrode to enable any oxide to be substantially removed from the sidewalls of the gate electrode during subsequent fabrication steps.

A mask 309 is then formed over the relatively thick oxide layer 307 and used to expose the active regions 311, as illustrated in FIGS. 3C and 3D. Again, the mask 305 may be formed by developing and selectively removing a photoresist using conventional photolithographic techniques. As described above, a portion of the relatively thick oxide layer 307 is removed to define an opening 321 which provides access to the active regions 311. The resultant structure is depicted in FIG. 3E. It should be appreciated that additional maskings may be used to expose other areas on the substrate 301 where access to the substrate 301 through the relatively thick oxide layer 305 is desired.

The exposed portions of the active regions 311 are then doped with a dopant to form lightly-doped regions 315 in the active regions 311. The lightly-doped regions extend between and slightly overlap with the gate electrode 303 and the remaining portion of the oxide layer 307 at the boundary of the opening 321. In the illustrated embodiment, the lightly-doped regions 315 form LDD regions. The resultant structure is depicted in FIG. 3D.

A spacer layer, typically an oxide layer such as $SiO_2$, is formed over the substrate 301 and the gate electrode 303 and portions of the spacer layer are removed to form spacers 305 on the sidewalls of the gate electrode 303. Following spacer formation, a source/drain implant may be used to implant a dopant into the active regions 311 to form heavily-doped regions 313. The resultant structure is depicted in FIG. 3E. The substrate 301 is then annealed to drive the dopant in the heavily-doped regions 313 to a desired depth within the substrate 301. The process may continue with silicidation and interconnect formation, for example, in a manner as described above.

The dopants used to form the lightly-doped and heavily-doped regions can thus be selectively implanted into a defined area of the substrate using the mask 309. This is in contrast with conventional techniques which implant into the entire well region, an area of the substrate surrounding the gate electrode. In addition, the advantages achieved by forming LDD structures at a later stage in the fabrication process are also provided.

The above processes can be used to form a number of different semiconductor devices, including but not limited to MOS structures such as p-type MOS devices (PMOS), n-type MOS devices (NMOS), and complimentary MOS (CMOS) semiconductor devices having both PMOS and NMOS devices. For example, in CMOS devices, the order in which LDD structure regions are formed and the time during the fabrication process at which these regions are formed can vary between the PMOS and NMOS device regions. For example, in PMOS device regions, LDD regions may be formed prior to heavily-doped regions, while in NMOS device regions the LDD structure regions are formed in a conventional order. As another example, the LDD structure in one type of device (NMOS or PMOS) may be formed prior to contact layer formation, while in the other type of device (PMOS or NMOS), the LDD structure may be formed after contact layer formation. Moreover, though FIGS. 2A–2G and 3A–3E illustrate the formation of a typical LDD structure, other LDD structures, such as double implant LDDs, buried LDDs, etc., may be formed using the above-described process.

FIGS. 4A–4E illustrate another embodiment of the invention in which a single active region of a semiconductor device is selectively exposed and doped after the formation of a relatively thick oxide layer. Though the process described below generally illustrates the formation of a source/drain structure having only a heavily-doped region, LDD structures may be formed as well.

Similar to FIGS. 3A–3C, gate electrodes (only one of which is shown) are formed on a substrate 401. The gate electrode 403 is typically insulated from the substrate by a thin gate oxide layer (not shown). Portions of the semiconductor substrate 401 which lie adjacent the gate electrode 403 generally define active regions 411a and 411b of the substrate 401.

Figure 4A:
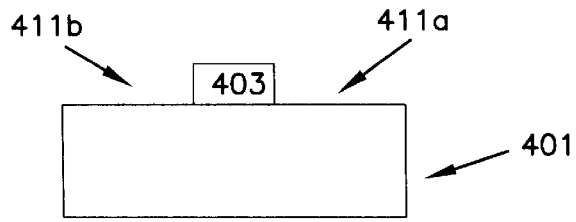
FIGS. 4A–4E illustrate still another fabrication process in accordance with another embodiment of the invention.
Figure 4B:
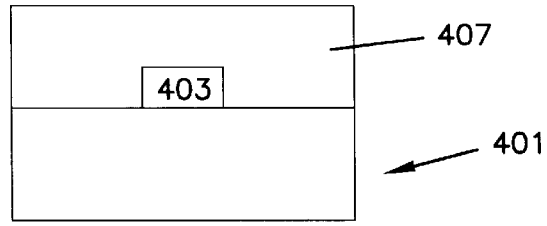
Figure 4C:
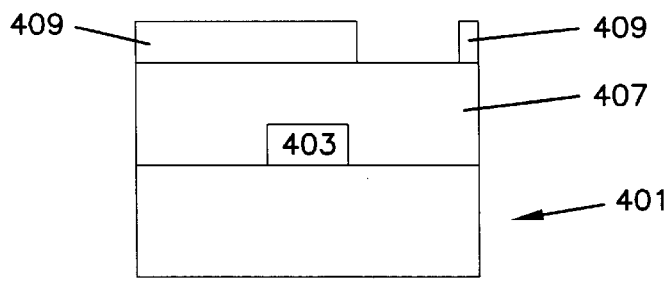
Figure 4D:
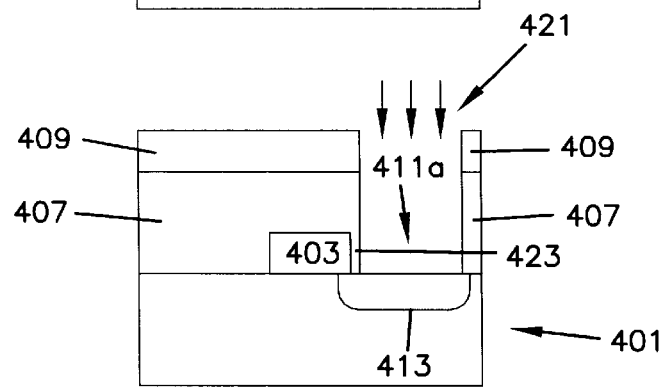

A relatively thick oxide layer 407 such as $SiO_2$ is formed over the substrate 401. The characteristics of the relatively thick oxide layer 407 are similar to those discussed above. A mask 409 is then formed over the relatively thick oxide layer 407 and used to selectively expose one of the active regions 411a, as illustrated in FIGS. 4C and 4D.

As described above, the active region 411a is exposed by removing a portion of the relatively thick oxide layer 407 to define an opening 421 which provides access only to the active region 411a. The mask may be positioned to leave a thin portion 423 of oxide on the sidewalls of the gate electrode to facilitate metal contact formation as will be discussed more fully below. It should be appreciated that additional masking may also be used to expose other areas on the substrate 401 where access to the substrate 401 through the relatively thick oxide layer 405 is desired. In one embodiment, both active regions 411a and 411b could be exposed to form both source and drains through subsequent dopant implantation. Still other access may be provided, for example, for contact formation. The exposed portion of the active region 411a is then doped with a dopant to form heavily-doped regions 413 in the active region 411a. The resultant structure is depicted in FIG. 4D.

Figure 4E:
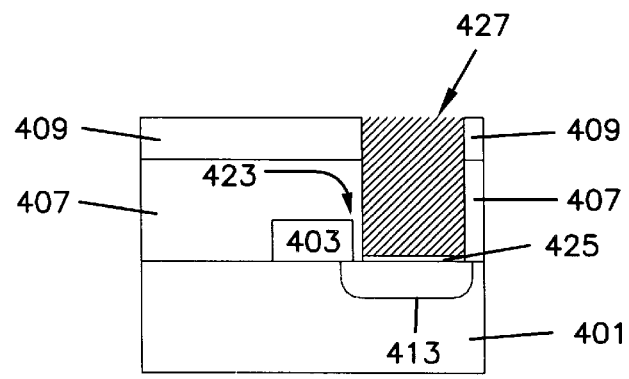

A silicide layer 425 can then be formed over the exposed active region 411a and the opening 421 filled with a conductive material to form metal contacts 427 to the active region 411a, as illustrated in FIG. 4E. The thin portion 423 of oxide adjacent the gate electrode 403 isolates the active region 411a from the gate electrode 403 and allows the silicide layer 425 to be disposed closer to the gate electrode 203. This reduces the parasitic resistance between the metal contact (to be formed) and the source/drain structure and enhances transistor performance. Moreover, by forming the active region 411a and the metal contact using the same opening, the metal contact-active region junction is improved and any shorting resulting from the metal contact contacting undoped silicon is reduced.

The selective exposure and doping of active regions provided by the above process also efficiently allows for asymmetric doping of active regions. This is beneficial where, for example, different active regions see different voltages such as when a series of transistors is formed on a substrate. In addition, the advantages achieved by forming source/drain structures at a later stage in the fabrication process are also provided.

As noted above, the present invention is applicable to the fabrication of a number of different devices where an active region is formed after the formation of a relatively thick oxide layer. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a semiconductor device, comprising:

forming a gate electrode on a substrate of the semiconductor device;

forming a relatively thick oxide layer over the gate electrode, wherein the relatively thick oxide layer comprises a contact formation layer;

removing portions of the relatively thick oxide layer to expose a region of the substrate adjacent the gate electrode;

doping the exposed region of the substrate with a dopant to form an active region in the substrate;

filling the removed portions of the contact formation layer with a second oxide;

removing portions of the second oxide to expose the active region and the gate electrode; and filling the removed portions of the second oxide with a conductive contact material.

2. The process of claim 1, further including:

forming a spacer on a sidewall of the gate electrode after forming the active region; and doping an exposed portion of the active region adjacent the spacer with a second dopant to form a heavily-doped source/drain region in the substrate.

3. The process of claim 1, further including:

forming a spacer on a sidewall of the gate electrode prior to forming the relatively thick oxide layer; and doping an exposed portion of the substrate adjacent the spacer with a dopant to form a heavily-doped source/drain region prior to forming the relatively thick oxide layer.

4. The process of claim 3, wherein removing portions of the relatively thick oxide layer includes removing the spacer.

5. The process of claim 3, wherein the active region is a lightly-doped source/drain region and the dopant used to form the lightly-doped source/drain region is implanted into the substrate at a concentration ranging from 1E14 to 1E15 dopant atoms/$cm^2$.

6. The process of claim 3, further including annealing the substrate after implanting the dopant used to form the active region.

7. The process of claim 6, wherein the annealing is performed at a temperature ranging from about 700° C. to 900° C.

8. The process of claim 1, further including forming a silicide layer on the exposed active region and a surface of the gate electrode prior to filling the removed portion of the second oxide with the conductive material.

9. The process of claim 1, wherein the active region comprises an LDD structure having a lightly-doped region.

10. The process of claim 9, wherein the lightly-doped region extends a lateral distance beneath the gate electrode, the distance being less than 100 angstroms.

11. The process of claim 1, wherein the relatively thick oxide layer comprises a planarized layer.

12. A process of forming a semiconductor device, comprising:
forming a gate electrode on a substrate;
implanting a second dopant to form a heavily-doped region in at least one active region of the substrate adjacent the gate electrode;
forming, over the gate electrode, a relatively thick oxide layer having a thickness greater than a thickness of the gate electrode after forming the heavily-doped region;
selectively removing portions of the relatively thick oxide layer to form an opening in the thick oxide layer exposing the at least one active region of the substrate adjacent the gate electrode; and
implanting a first dopant through the opening into the exposed active region of the substrate to form an LDD region in the active region; wherein the heavily-doped region and LDD region form an LDD source/drain region.

13. The process of claim 12, wherein implanting the first dopant includes implanting the first dopant into the substrate at a dosage ranging from 1E14 to 1E15 dopant atoms/cm$^2$.

14. The process of claim 13, further including performing a first anneal of the substrate after implanting the second dopant and before implanting the first dopant to activate the second dopant.

15. The process of claim 14, further including performing a second anneal of the substrate after implanting the first dopant, wherein the second anneal is performed at a lower temperature than the first anneal.

16. The process of claim 15, wherein the second anneal is performed at a temperature ranging from 700 to 900° C.

17. The process of claim 12, further including forming a spacer on the gate electrode prior to implanting the second dopant, the spacer being used as a mask during the implant of the second dopant, wherein selectively removing portions of the thick oxide layer includes removing the spacer.

18. The process of claim 12, wherein the thick oxide layer has a thickness of 3000 angstroms or more.

19. The process of claim 12, wherein the thick oxide layer has a thickness of about 10000 angstroms.

20. The process of claim 12, further including laterally diffusing the LDD region beneath the gate electrode by less than 100 angstroms.

21. The process of claim 12, further including forming a spacer in the opening and adjacent the gate electrode after forming the LDD region and forming a silicide layer over the exposed active region after forming the spacer.

22. The process of claim 12, further including filling the opening with a second oxide and removing portions of the second oxide to form a contact opening to the active region.

23. The process of claim 12, wherein the relatively thick oxide layer comprises a contact formation layer.

24. The process of claim 12, further including forming a spacer adjacent the gate electrode before implanting the first dopant to space the heavily-doped region from the gate electrode;
wherein the LDD region extends between the heavily-doped region and the gate electrode.

25. A process of forming a semiconductor device, comprising:
forming a gate electrode on a substrate;
forming, over the gate electrode, an oxide layer having a thickness greater than a thickness of the gate electrode;
selectively removing portions of the oxide layer to form an opening in the oxide layer exposing the gate electrode and active regions of the substrate adjacent the gate electrode; and
implanting a first dopant through the opening into the exposed active regions of the substrate to form a source/drain structure in each active region;
further including implanting a second dopant into the active regions before forming the oxide layer to form a heavily-doped region in each active region, wherein the source/drain structure in each active region formed by implanting dopant through the opening is an LDD region, each LDD region and associated heavily-doped region forming an LDD source/drain region.

26. The process of claim 25, further including forming spacers adjacent the gate electrode before implanting the second dopant to space the heavily-doped regions from the gate electrode;
wherein each LDD region extends between an associated heavily-doped region and the gate electrode.

27. A process of forming a semiconductor device, comprising:
forming a gate electrode on a substrate;
forming a heavily-doped region in an active region of the substrate adjacent the gate electrode;
forming, over the gate electrode, a relatively thick oxide layer having a thickness greater than a thickness of the gate electrode after forming the heavily-doped source/drain region;
selectively removing portions of the relatively thick oxide layer to form an opening in the thick oxide layer exposing the active region of the substrate adjacent the gate electrode; and
forming through the opening a lightly-doped region in the active region; wherein the lightly-doped region and the heavily-doped region together form a source/drain region.

28. The process of claim 27, wherein forming the heavily-doped region includes performing a first anneal of the substrate before forming the lightly-doped region and forming the lightly-doped region includes performing a second anneal of the substrate after the first anneal, the second anneal being performed at a lower temperature than the first anneal.

29. The process of claim 28, wherein the second anneal is performed at a temperature ranging from 700 to 900 degrees C. and the first anneal is performed at a temperature ranging from 1100 to 1200 degrees C.

* * * * *